(12) United States Patent
Zhong et al.

(10) Patent No.: US 8,269,307 B2
(45) Date of Patent: Sep. 18, 2012

(54) SHALLOW TRENCH ISOLATION STRUCTURE AND METHOD FOR FORMING THE SAME

(75) Inventors: Huicai Zhong, Beijing (CN); Haizhou Yin, New York, NY (US); Qingqing Liang, Beijing (CN); Huilong Zhu, New York, NY (US)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 0 days.

(21) Appl. No.: 13/119,004

(22) PCT Filed: Jan. 27, 2011

(86) PCT No.: PCT/CN2011/070693
§ 371 (c)(1),
(2), (4) Date: Mar. 15, 2011

(87) PCT Pub. No.: WO2012/065370
PCT Pub. Date: May 24, 2012

(65) Prior Publication Data
US 2012/0126244 A1    May 24, 2012

(30) Foreign Application Priority Data
Nov. 19, 2010  (CN) .......................... 2010 1 0552589

(51) Int. Cl.
*H01L 29/15* (2006.01)
(52) U.S. Cl. ........... 257/513; 257/77; 438/269; 438/388
(58) Field of Classification Search ................ 257/77, 257/513; 438/269, 388
See application file for complete search history.

(56) References Cited

U.S. PATENT DOCUMENTS

| 5,923,073 | A  | * | 7/1999 | Aoki et al. | 257/501 |
| 6,218,273 | B1 | * | 4/2001 | Kang | 438/590 |
| 6,555,891 | B1 | * | 4/2003 | Furukawa et al. | 257/505 |
| 6,723,618 | B2 | * | 4/2004 | Meyer et al. | 438/429 |
| 6,737,688 | B2 | * | 5/2004 | Kim | 257/288 |
| 6,893,940 | B2 |   | 5/2005 | Yu | |
| 7,176,138 | B2 | * | 2/2007 | Chen et al. | 438/700 |

(Continued)

FOREIGN PATENT DOCUMENTS

CN    1230020    9/1999
(Continued)

OTHER PUBLICATIONS

PCT International Search Report PCT/CN2011/070693 (Jul. 28, 2011).

(Continued)

*Primary Examiner* — Marcos D. Pizarro
*Assistant Examiner* — Bilkis Jahan
(74) *Attorney, Agent, or Firm* — Goodwin Procter LLP

(57) ABSTRACT

The invention provides a STI structure and a method for manufacturing the same. The STI includes a semiconductor substrate; a first trench formed on the upper surface of the semiconductor substrate and filled with an epitaxial layer, wherein the upper surface of the epitaxial layer is higher than that of the semiconductor substrate; and a second trench formed on the epitaxial layer and filled with a first dielectric layer, wherein the upper surface of the first dielectric layer is flush with that of the epitaxial layer, and the width of the second trench is smaller than that of the first trench. The invention reduces the influences of divots on performance of the semiconductor device.

22 Claims, 7 Drawing Sheets

U.S. PATENT DOCUMENTS

| | | | |
|---|---|---|---|
| 7,390,710 B2 * | 6/2008 | Derderian et al. | 438/222 |
| 7,659,179 B2 * | 2/2010 | Hu | 438/418 |
| 2003/0211703 A1 * | 11/2003 | Lee et al. | 438/430 |
| 2004/0127061 A1 * | 7/2004 | Yu | 438/758 |
| 2005/0142799 A1 * | 6/2005 | Seo | 438/424 |
| 2006/0099771 A1 | 5/2006 | Chen et al. | |
| 2006/0145288 A1 * | 7/2006 | Ko | 257/510 |
| 2009/0096055 A1 * | 4/2009 | Montgomery et al. | 257/510 |

FOREIGN PATENT DOCUMENTS

| | | |
|---|---|---|
| KR | 20010009810 | 2/2001 |

OTHER PUBLICATIONS

PCT Written Opinion (Jul. 28, 2011).

* cited by examiner

SHALLOW TRENCH ISOLATION STRUCTURE AND METHOD FOR FORMING THE SAME

CROSS REFERENCE TO RELATED APPLICATIONS

The present application claims priority to PCT Application No. PCT/CN2011/070693, filed Jan. 27, 2011, which claimed priority to Chinese Patent Application No. 201010552589.8, entitled "SHALLOW TRENCH ISOLATION STRUCTURE AND METHOD FOR FORMING THE SAME", filed Nov. 19, 2010. Both the PCT application and the Chinese application are incorporated herein by reference in their entireties.

FIELD OF THE INVENTION

The present invention relates to semiconductor manufacturing technology, and particularly, relates to a Shallow Trench Isolation (STI) structure and a method for manufacturing the same.

BACKGROUND OF THE INVENTION

As the semiconductor technology advances into deep submicron era, active areas of semiconductor devices, such as a MOS transistor, are generally isolated by STI structures. The method for fabricating the shallow trench isolation structure comprises: forming a shallow trench on a substrate by an etching process for isolating active areas within the substrate; filling up the shallow trench with a dielectric material to further cover the surface of the substrate; and planarizing the dielectric material to expose the surface of the substrate, wherein the planarization may be Chemical Mechanical Polishing (CMP). After formation of the STI, semiconductor devices, such as MOS transistors, are fabricated on the active areas between the STIs.

FIG. 1 shows STI structures formed by prior art, comprising: a semiconductor substrate 10; and STIs formed within the substrate, wherein the STIs are filled with dielectric materials 11, an active area is formed between the STIs within the substrate, and a semiconductor device (such as a MOS transistor comprising a gate structure, a source area and a drain area) is formed in the active area. However, in the prior art STIs, because of the planarization process and the cleaning process thereafter, downward depressions are formed between the surface of the dielectric material 11 and the surface of the adjacent substrate 10, which depressions are referred to divots 12. The divots 12 may lead to high leakage current and performance degradation of the semiconductor device. Moreover, with the scaling of the dimension of semiconductor devices, the dimension of the divots relative to the semiconductor device formed between the STIs becomes bigger, influences on performance of the semiconductor device become increasingly serious.

SUMMARY OF THE INVENTION

An object of the present invention is to provide a STI and a manufacturing method thereof for reducing the influences of divots on performance of the semiconductor device.

To achieve the object, the present invention provides a STI, comprising:
a semiconductor substrate;
a first trench formed on the upper surface of the semiconductor substrate and filled with an epitaxial layer, wherein the upper surface of the epitaxial layer is higher than that of the semiconductor substrate; and
a second trench formed on the epitaxial layer and filled with a first dielectric layer, wherein the upper surface of the first dielectric layer is flush with that of the epitaxial layer, and the width of the second trench is smaller than that of the first trench.

Optionally, the semiconductor substrate is any one of a silicon substrate, a silicon germanium substrate, a III-V compound substrate, a silicon carbide substrate or a stacked structure thereof, or a silicon on insulator substrate, or a diamond substrate.

Optionally, the upper surface of the epitaxial layer is higher than that of the semiconductor substrate by 20 nm to 30 nm.

Optionally, material of the epitaxial layer is different from that of the semiconductor substrate.

Optionally, the semiconductor substrate is a silicon substrate, and the material of the epitaxial layer is silicon carbide or silicon germanium.

Optionally, the epitaxial layer comprises a first epitaxial layer and a second epitaxial layer located on thereon.

Optionally, material of the first epitaxial layer is different from that of the semiconductor substrate, and the material of the second epitaxial layer is the same as that of the semiconductor substrate.

Optionally, the semiconductor substrate is a silicon substrate, the material of the first epitaxial layer is silicon carbide or silicon germanium, and the material of the second epitaxial layer is monocrystalline silicon.

Optionally, the STI structure further comprises a third trench formed on the upper surface of the semiconductor substrate and filled with a second dielectric layer, wherein the third trench extends in a direction perpendicular to the first trench and the second trench.

Optionally, the second trench penetrates through the epitaxial layer.

To achieve the object, the present invention further provides a method for manufacturing a STI, comprising:
providing a semiconductor substrate;
forming a first trench in the semiconductor substrate;
forming an epitaxial layer in the first trench, wherein the upper surface of the epitaxial layer is higher than that of the semiconductor substrate;
forming a second trench in the epitaxial layer, wherein the width of the second trench is smaller than that of the first trench; and
filling the second trench to form a first dielectric layer, wherein the upper surface of the first dielectric layer is flush with that of the epitaxial layer.

Optionally, the semiconductor substrate is any one of a silicon substrate, a silicon germanium substrate, a III-V compound substrate, a silicon carbide substrate, or a stacked structure thereof, or a silicon on insulator substrate, or a diamond substrate.

Optionally, the upper surface of the epitaxial layer is higher than that of the semiconductor substrate by 20 nm to 30 nm.

Optionally, the epitaxial layer is formed by epitaxial growth or solid phase epitaxy.

Optionally, the material of the epitaxial layer is different from that of the semiconductor substrate.

Optionally, the semiconductor substrate is a silicon substrate, and the material of the epitaxial layer is silicon carbide or silicon germanium.

Optionally, forming a first trench in the semiconductor substrate comprises:
forming a liner layer and a hard mask layer sequentially on the semiconductor substrate;

etching the liner layer and the hard mask layer to define the pattern of the first trench; and etching the semiconductor substrate by using the hard mask layer as a mask to form the first trench.

Optionally, forming an epitaxial layer in the first trench comprises:

forming a first epitaxial layer in the first trench; and forming a second epitaxial layer on the first epitaxial layer, wherein the upper surface of the second epitaxial layer is higher than that of the semiconductor substrate and lower than that of the hard mask layer.

Optionally, the material of the first epitaxial layer is different from that of the semiconductor substrate, and the material of the second epitaxial layer is the same as that of the semiconductor substrate.

Optionally, the semiconductor substrate is a silicon substrate, the material of the first epitaxial layer is silicon carbide or silicon germanium, and the material of the second epitaxial layer is monocrystalline silicon.

Optionally, forming a second epitaxial layer comprises:

forming spacers on sidewalls of the hard mask layer on the second epitaxial layer; and etching the second epitaxial layer, the first epitaxial layer and the semiconductor substrate by using the spacers as masks to form the second trench.

Optionally, filling the second trench to form a first dielectric layer comprises:

filling the second trench to form the first dielectric layer, and planarizing the first dielectric layer until the upper surface of the first dielectric layer is flush with that of the hard mask layer; and removing the liner layer, the hard mask layer, the spacers, and a part of the first dielectric layer which is higher than the epitaxial layer.

Optionally, the spacers and the hard mask layer are made of the same material, and the spacers and the hard mask layer are removed by a wet etching process at the same time.

Optionally, the spacers and the hard mask layer are made of silicon nitride, and the solution used in the wet etching process is hot phosphoric acid solution.

Optionally, the method for manufacturing the STI further comprises: forming a third trench on the upper surface of the semiconductor substrate, wherein the third trench extends in a direction perpendicular to the first trench and the second trench; and filling the third trench with a second dielectric layer.

Optionally, the second trench penetrates through the epitaxial layer.

In comparison with conventional technologies, the present invention has the following advantages.

In the present invention, a first trench is firstly formed within a semiconductor substrate and is filled into the first trench to form an epitaxial layer, wherein the upper surface of the epitaxial layer is higher than that of the semiconductor substrate. Then, a second trench is formed on the epitaxial layer and filled with a first dielectric layer, wherein the width of the second trench is smaller than that of the first trench, whereby dimensions of divots formed between the first dielectric layer and the epitaxial layer are smaller, and influences of the divots on performance of the semiconductor device are reduced.

In addition, the surface of the second epitaxial layer is higher than that of the semiconductor substrate, therefore, the divots formed between the first dielectric layer and the second epitaxial layer are located above the surface of the semiconductor substrate. Meanwhile, the semiconductor device is formed on the surface of the semiconductor substrate which is between the STIs, thereby reducing the influences on performance of the MOS transistors fabricated on the semiconductor substrate.

Furthermore, the material of the epitaxial layer is different from that of the semiconductor substrate, which may cause stress on the semiconductor substrate, thereby improving performance of the semiconductor device.

DESCRIPTION OF THE PREFERRED EMBODIMENTS

In STI structures manufactured in the prior art, divots are formed between a surface of the dielectric material filled in the STIs and a surface of the substrate, which may lead to leakage current and performance degradation of the semiconductor device.

According to the present invention, firstly, a first trench is formed in a semiconductor substrate, and the first trench is filled to form an epitaxial layer. Then, a second trench is formed in the epitaxial layer, and the second trench is filled to form a first dielectric layer. The surface of the epitaxial layer is higher than that of the semiconductor substrate, and the width of the second trench is smaller than that of the first trench. Because the width of the second trench is smaller than that of the first trench, the dimension of the divots formed between the first dielectric material and the epitaxial layer is small, which is advantageous to alleviate negative effects of the divots on performance of the semiconductor device.

In addition, because the surface of the epitaxial layer is higher than that of the semiconductor substrate, the divots formed in the second trench and between the first dielectric layer and the epitaxial layer are higher than the surface of the semiconductor substrate. Moreover, the semiconductor devices are formed on the surface of the semiconductor substrate between the STIs, which is also advantageous to alleviate negative effects of the divots on performance of the semiconductor device.

Furthermore, in the specification, because the material of the epitaxial layer is different from that of the semiconductor substrate, stress may be applied to the semiconductor substrate, which may improve performance of the semiconductor device.

Hereafter, the present invention will be described in detail with reference to embodiments, in conjunction with the accompanying drawings.

Although the present invention has been disclosed hereinafter as above with reference to preferred embodiments in detail for better understanding, the present invention may be implemented in other different embodiments. Therefore, the present invention should not be limited to the embodiments disclosed herein.

Figure 1:
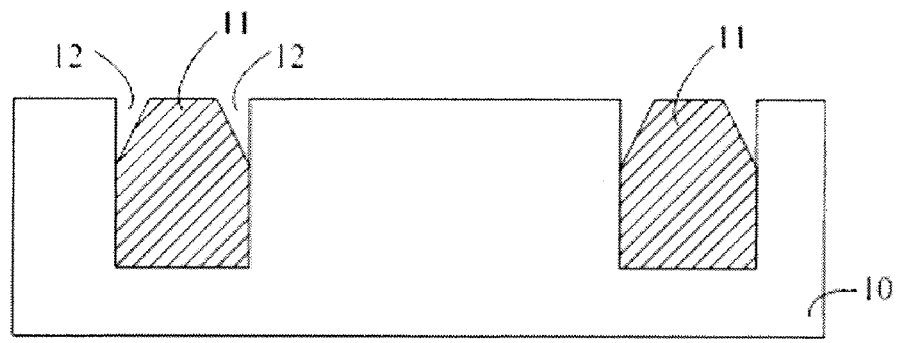
FIG. 1 shows a cross section view of STIs formed in the prior art.
Figure 2:
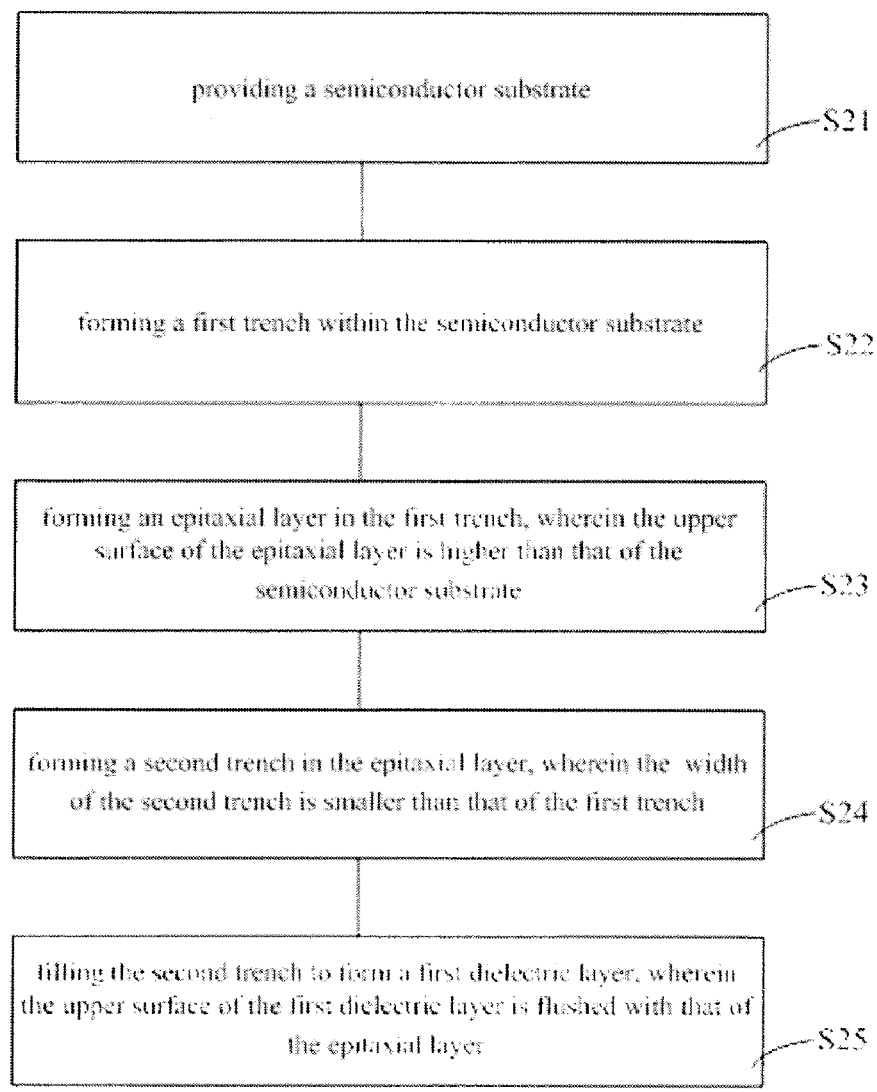
FIG. 2 is a flow chart of a method for manufacturing STIs in the first embodiment.

FIG. 2 is a flow chart of a method for manufacturing STIs in the first embodiment. Referring to FIG. 2, the method for manufacturing the STI comprises:

step S21: providing a semiconductor substrate;

step S22: forming a first trench in a semiconductor substrate;

step S23: forming an epitaxial layer in the first trench, wherein the surface of the epitaxial layer is higher than that of the semiconductor substrate;

step S24: forming a second trench in the epitaxial layer, wherein the width of the second trench is smaller than that of the first trench; and step S25: filling the second trench to form a first dielectric layer, wherein the surface of the first dielectric layer is flush with that of the epitaxial layer.

Figure 13:
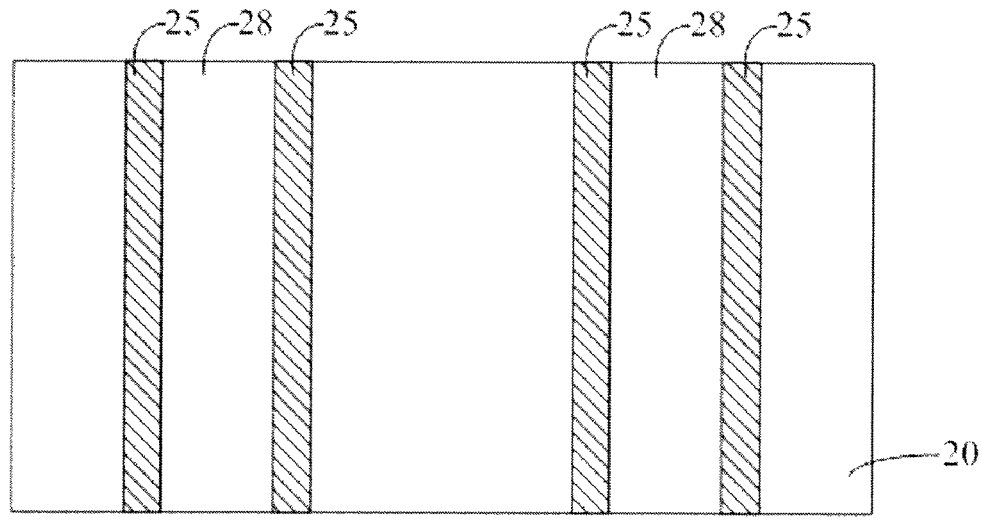
FIG. 13 to FIG. 15 are top views of intermediate structures in the method for manufacturing the STIs according to the embodiment of the present invention.
Figure 14:
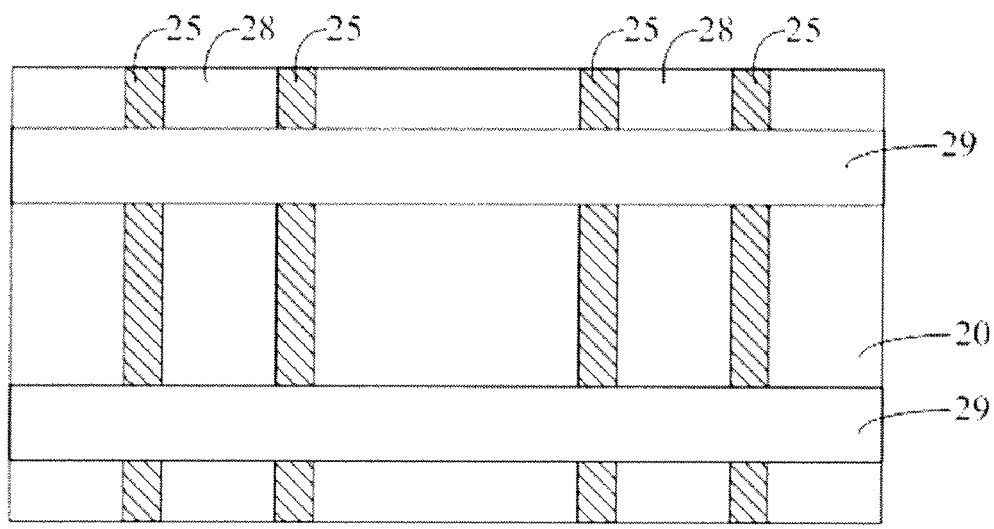
Figure 15:
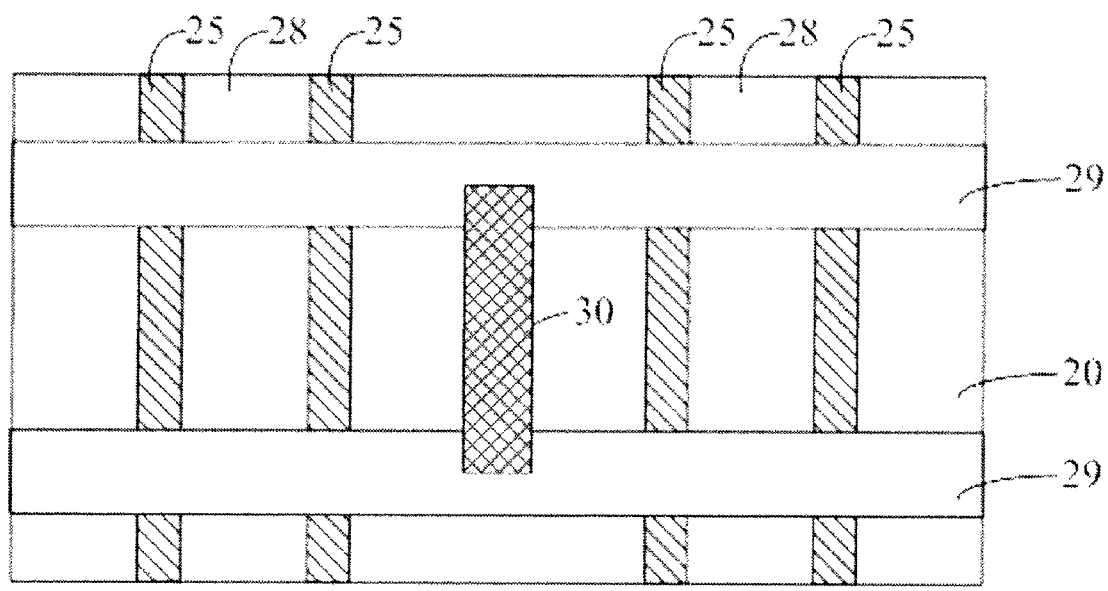

FIG. 3 to FIG. 12 are cross section views of the intermediate structures in the method for manufacturing the STIs according to an embodiment of the present invention. FIG. 13 to FIG. 15 are top views of the intermediate structures in the method for manufacturing the STIs according to the embodiment of the present invention. The embodiments of the present invention will be described in detail with reference to FIG. 2 to FIG. 15 hereafter.

Figure 3:
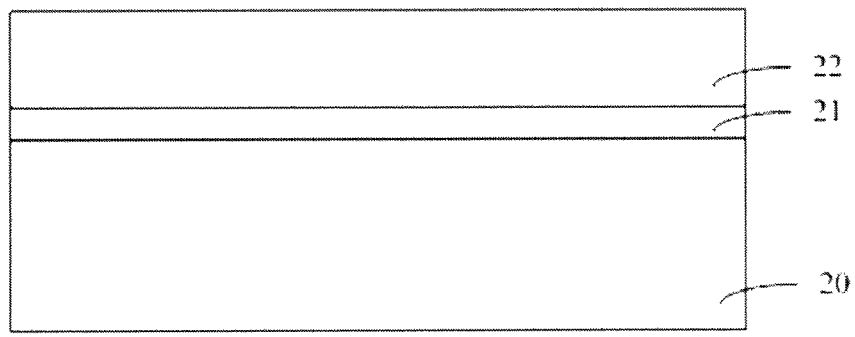
FIG. 3 to FIG. 12 are cross section views of intermediate structures in a method for manufacturing the STIs according to an embodiment of the present invention.
Figure 4:
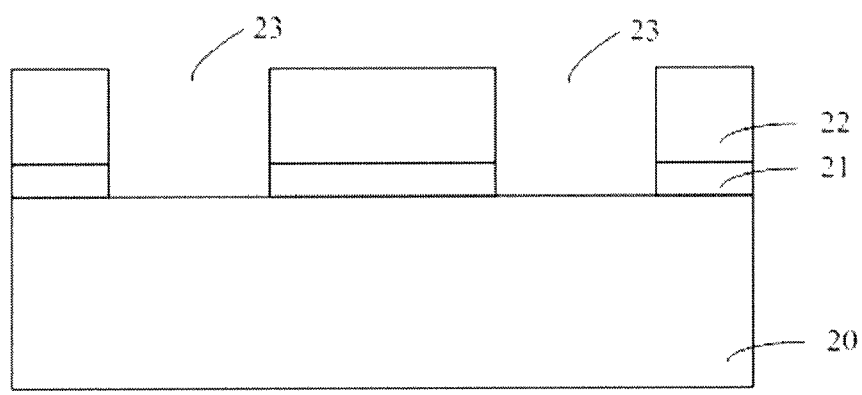

Referring to FIG. 2 and FIG. 3, a semiconductor substrate is provided by performing the step S21. Specifically, a semiconductor substrate 20 is provided. The semiconductor substrate 20 may be a silicon substrate, a silicon germanium substrate, a III-V compound (such as gallium arsenide, indium phosphide, gallium nitride, etc.) substrate, a silicon carbide substrate, or a stacked structure thereof, or a silicon on insulator substrate, or a diamond substrate, or any other semiconductor substrates known to the persons skilled in the art. The semiconductor substrate 20 of the embodiments is a silicon substrate. A liner layer 21 and a hard mask layer 22 are formed sequentially on the semiconductor substrate 20. The liner layer 21 is made of silicon oxide, and the hard mask layer 22 is made of silicon nitride.

Figure 5:
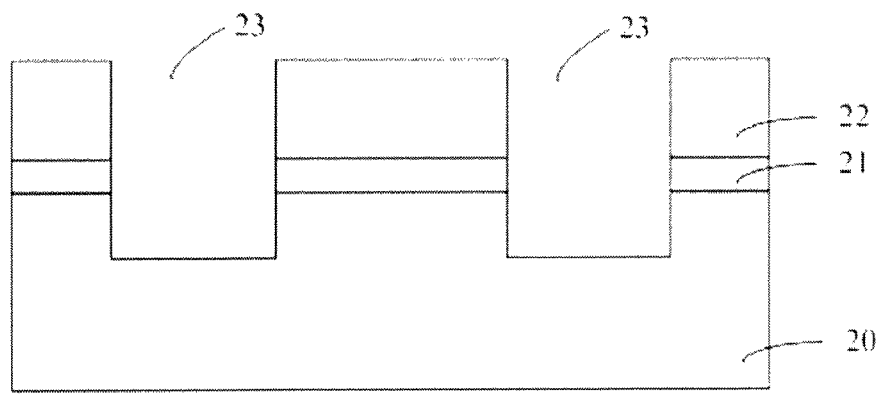

Referring to FIG. 2, and FIG. 3 to FIG. 5, a first trench is formed in the semiconductor substrate by performing the step S22. Firstly, referring to FIG. 3, the liner layer 21 and the hard mask layer 22 are etched to define the pattern of a first trench 23. The etching process comprises: forming a photoresist layer on the hard mask layer 22 (not shown in the figure) and patterning the photoresist layer to define the pattern of the first trench 23. Then, referring to FIG. 4, the liner layer 21 and the hard mask layer 22 are etched with the patterned photoresist layer as a mask, so as to transfer the pattern of the first trench 23 to the liner layer 21 and the hard mask layer 22. Finally, the photoresist layer is removed by an ashing process. Referring to FIG. 5, the first trench 23 is formed by etching the semiconductor substrate 20 using the hard mask layer 22 as a mask, wherein the etching may be wet etching, dry etching, and so on.

Figure 6:
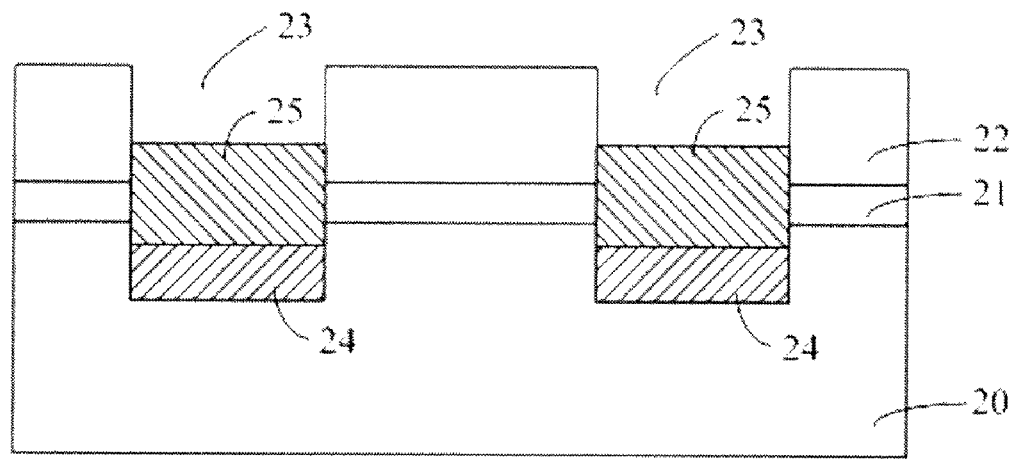

Referring to FIG. 2 and FIG. 6, the step S23 is performed. An epitaxial layer is formed in the first trench, and the surface of the epitaxial layer is higher than that of the semiconductor substrate. Specifically, the epitaxial layer is formed in the first trench 23. The epitaxial layer comprises a first epitaxial layer 24 and a second epitaxial layer 25 thereon, wherein the surface of the second epitaxial layer 25 is higher than that of the semiconductor substrate 20. The method for forming the epitaxial layer comprises: forming the first epitaxial layer 24 in the first trench 23 by epitaxial growth, solid phase epitaxy or other methods known to those skilled in the art; and forming the second epitaxial layer 25 on the first epitaxial layer 24 by epitaxial growth, solid phase epitaxy or other methods known to those skilled in the art. The surface of the second epitaxial layer 25 is higher than the surface of the semiconductor substrate 20, and is lower than the surface of the hard mask layer 22.

Material of the first epitaxial layer 24 may be the same as or different from that of the semiconductor substrate 20. In the present embodiments, the material of the first epitaxial layer 24 is different from the material of the semiconductor substrate 20, and may be, for example, silicon carbide or silicon germanium. Because the material of the first epitaxial layer 24 is different from that of the semiconductor substrate 20, the lattice constant of the first epitaxial layer 24 is different from that of the semiconductor substrate 20, so that the first epitaxial layer 24 may apply stress to the semiconductor substrate 20, for example, compressive stress caused by silicon germanium, or tensile stress caused by silicon carbide. The compressive stress along the channel direction may enhance performance of a PMOS transistor, and the tensile stress along the channel direction may enhance performance of an NMOS transistor. The material of the second epitaxial layer 25 may be the same as or different from that of the semiconductor substrate 20. In the present embodiments, the material of the second epitaxial layer 25 is the same as that of the semiconductor substrate 20, both of which are monocrystalline silicon.

It should be noted that in other embodiments, the epitaxial layer may be a single-layer structure, which is formed in the first trench 23 through epitaxial growth, solid phase epitaxy or other methods, and the surface of the epitaxial layer in a single-layer structure is higher than that of the semiconductor substrate 20. Similarly, the material of the epitaxial layer in a single-layer structure may be the same as or different from that of the semiconductor substrate 20. Utilization of different materials may apply stress to the semiconductor substrate 20, which may enhance performance of the semiconductor device formed on the semiconductor substrate 20.

Referring to FIG. 2, and FIG. 7 to FIG. 9, the step S24 is performed. A second trench is formed in the epitaxial layer, and the width of the second trench is smaller than that of the first trench.

Figure 7:
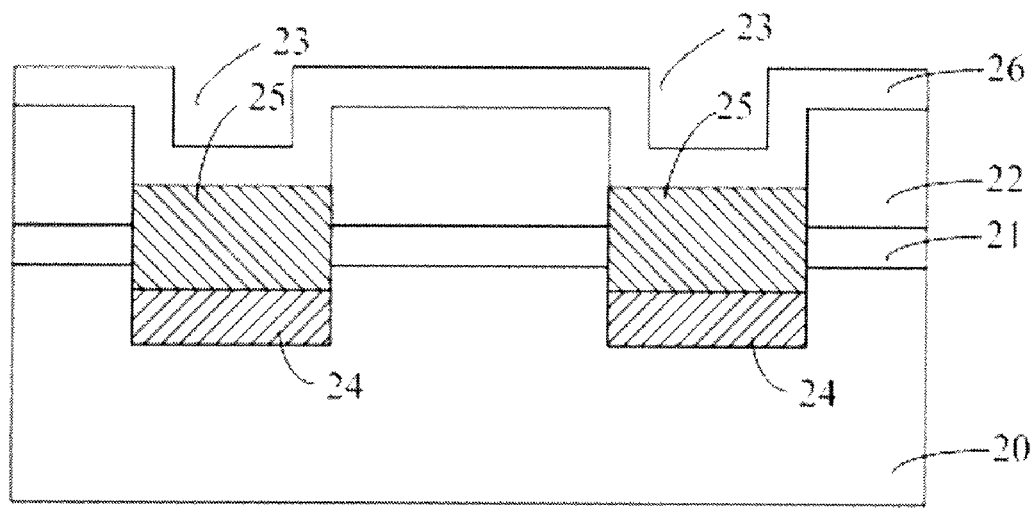

Specifically, referring to FIG. 7, a dielectric material layer 26 is formed to cover the surface of the second epitaxial layer 25 and the surface and sidewalls of the hard mask layer 22. The method for forming the dielectric material layer 26 may be Chemical Vapor Deposition, and the material of the dielectric material layer 26 may be silicon oxide, silicon nitride, and so on. In the embodiments, the material of the dielectric material layer 26 is the same as that of the hard mask layer 22, i.e., silicon nitride.

Figure 8:
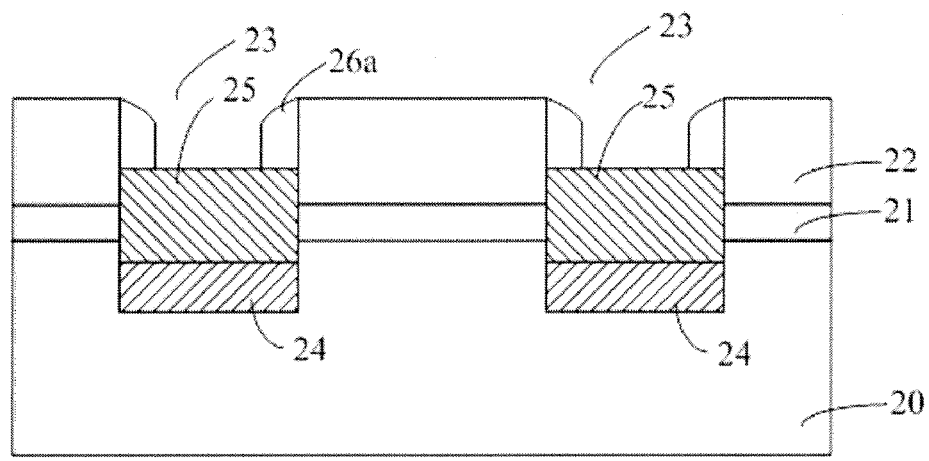

Referring to FIG. 8, an anisotropic etching process, such as dry etching, is performed on the dielectric material layer 26 to form spacers 26a on the surface of the second epitaxial layer 25 and on sidewalls of the hard mask layer 22.

Figure 9:
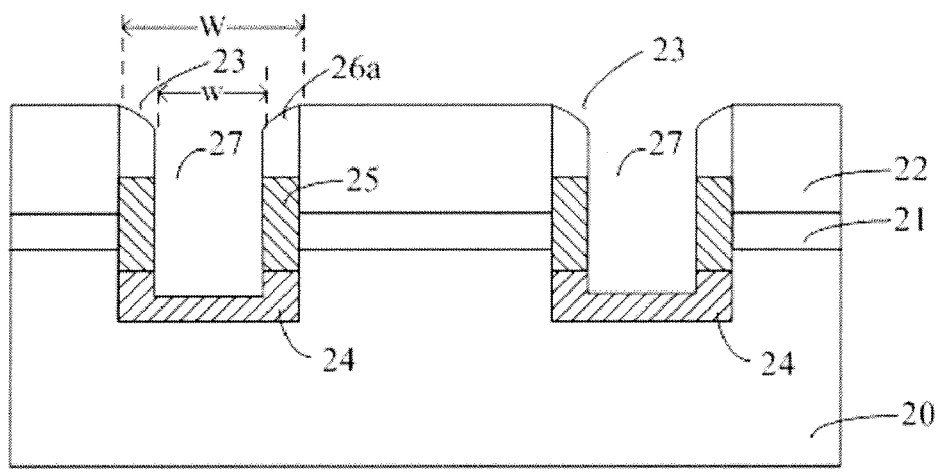

Referring to FIG. 9, using the spacers 26a as masks, an etching process is performed on the second epitaxial layer 25, the first epitaxial layer 24 and the semiconductor substrate 20 to form a second trench 27. The etching process may be dry etching, wet etching, etc. The second trench 27 is formed in the first epitaxial layer 24 and the second epitaxial layer 25, with the first epitaxial layer 24 exposed at the bottom of the second trench 27. Because the spacers 26a are used as etching masks, the width w of the second trench 27 is smaller than the width W of the first trench 23. Furthermore, the thickness of the spacers 26a may be adjusted by adjusting the thickness of the dielectric material layer 26 in FIG. 7, so as to adjust the width w of the second trench 27.

In other embodiments, the second trench 27 may penetrate through the epitaxial layers. In other words, the depth of the second trench 27 may be bigger than the depth of the first epitaxial layer 24 and the second epitaxial layer 25, with the semiconductor substrate 20 exposed at the bottom of the second trench 27.

Referring to FIG. 2, and FIG. 10 to FIG. 12, the step S25 is performed. The second trench is filled to form a first dielectric layer, and the surface of the first dielectric layer is flush with that of the epitaxial layer.

Figure 10:
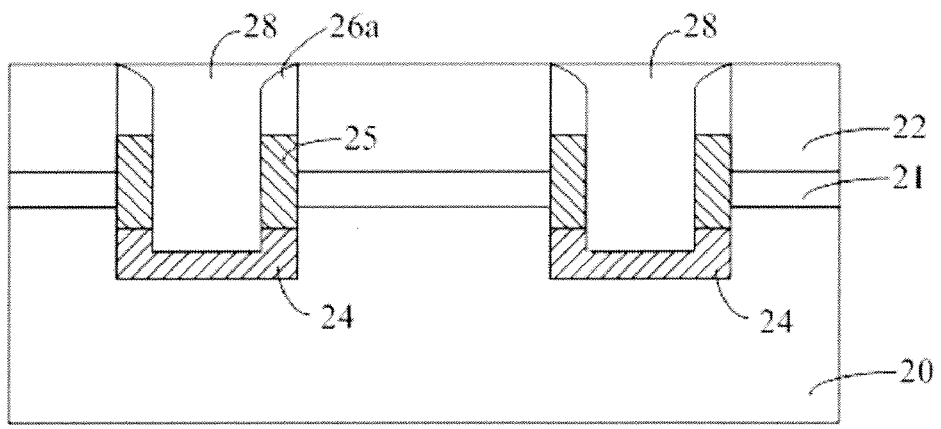

Specifically, referring to FIG. 10, a first dielectric layer 28 is formed by filling the second trench, and then the first dielectric layer 28 is planarized until the surface of the first dielectric layer 28 is flush with the surface of the hard mask layer 22. The first dielectric layer 28 may be made of silicon oxide, silicon nitride, or a stacked structure thereof, or other dielectric materials known to those skilled in the art. In the embodiments, the first dielectric layer 28 is made of silicon oxide, and is formed through Chemical Vapor Deposition. The planarization is performed by using CMP.

Figure 11:
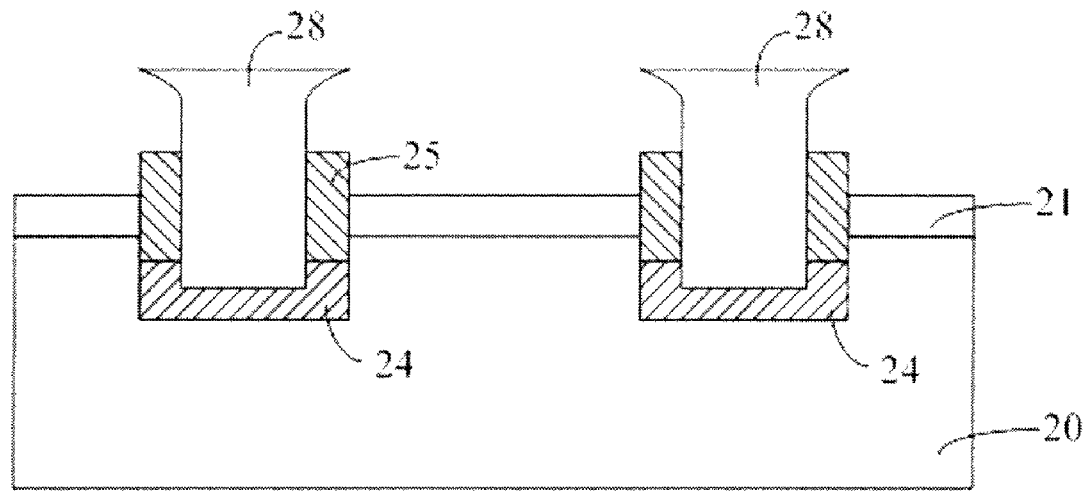

Referring to FIG. 11, the spacers and the hard mask layer is removed to expose the second epitaxial layer 25 and the liner layer 21. In the embodiments, the spacers and the hard mask layer are both made of silicon nitride. Therefore, they may be removed using wet etching at the same time, which simplifies the process. The solution used in the wet etching process is hot phosphoric acid solution.

Figure 12:
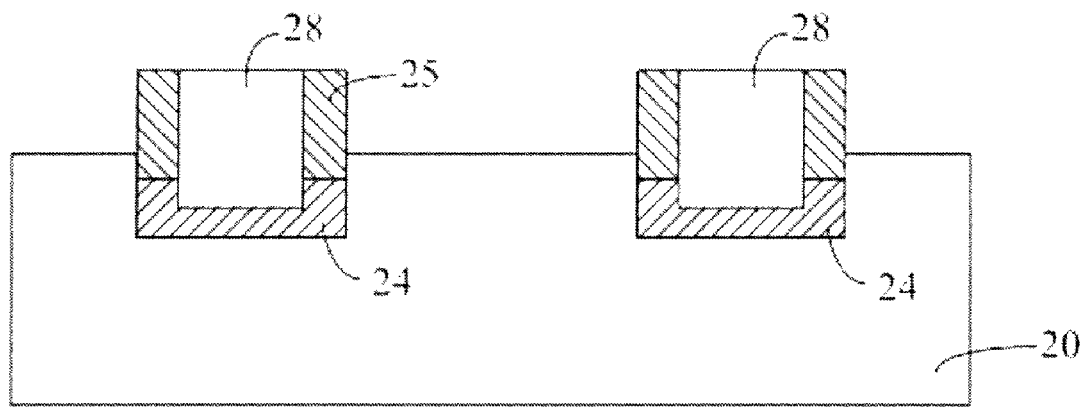

Referring to FIG. 12, the liner layer 21 and part of the first dielectric layer 28 which is higher than the second epitaxial layer 25 are removed until the surface of the semiconductor substrate 20 is exposed, so that the surface of the first dielectric layer 28 is flush with the surface of the second epitaxial layer 25. The liner layer 21 and part of the first dielectric layer 28 which is higher than the second epitaxial layer 25 may be removed using wet etching. The solution used in the wet etching process may be hydrofluoric acid solution. Besides, dry etching also may be used to remove the liner layer 21 and part of the first dielectric layer 28 which is higher than the second epitaxial layer 25.

Thus, the cross section view of the STIs manufactured in the embodiments is shown in FIG. 12 and the top view is shown in FIG. 13, comprising: the semiconductor substrate 20; the first trench formed on the surface of the semiconductor substrate 20, and filled with the first epitaxial layer 24 and the second epitaxial layer 25, wherein the surface of the epitaxial layer 25 is higher than the surface of the semiconductor substrate 20; the second trench formed on the first epitaxial layer 24 and the second epitaxial layer 25, and filled with the first dielectric layer 28, wherein the surface of the first dielectric layer 28 is flush with the second epitaxial layer 25, and the width of the second trench is smaller than the width of the first trench.

Furthermore, in other embodiments, the epitaxial layer formed in the first trench may be a single-layer structure, the surface of the epitaxial layer is higher than the semiconductor substrate 20, and the surface of the first dielectric layer 28 is flush with the epitaxial layer. In addition, the second trench may penetrate through the epitaxial layer.

The STIs in the present embodiments may further comprise a third trench extending in a direction perpendicular to the first trench and the second trench. Referring to the top view of FIG. 14, the third trench is formed on the semiconductor substrate 20, wherein the third trench extends in a direction perpendicular to the first trench and the second trench. The third trench is filled to form a second dielectric layer 29. The second dielectric layer 29 may be made of the same or different material with the first dielectric layer 28. Referring to the top view of FIG. 15, a gate stack 30 is formed on the semiconductor substrate 20 comprising a gate dielectric layer and a gate electrode formed thereon. The gate stack 30 extends in a direction parallel to the first trench and the second trench. Then, a source area and a drain area are formed in the semiconductor substrate 20 at both sides of the gate stack 30 (not shown in the figures), thereby forming a MOS transistor.

Referring to FIG. 12, because the width of the second trench is smaller than that of the first trench, the surface area of the first dielectric layer 28 exposed in the second trench is smaller. Accordingly, dimensions of divots formed between the first dielectric layer 28 and the second epitaxial layer 25 (not shown in the figure) are smaller, thereby reducing the influences on performance of the semiconductor device. In addition, the surface of the second epitaxial layer 25 is higher than that of the semiconductor substrate 20. Therefore, the divots formed between the first dielectric layer 28 in the second trench and the second epitaxial layer 25 are higher than the surface of the semiconductor substrate 20, which reduces the influences on performance of the MOS transistors fabricated on the semiconductor substrate 20.

Furthermore, the material of the epitaxial layers in the first trench may be different from that of the semiconductor substrate 20. In the embodiments, the material of the first epitaxial layer 24 in the first trench is different from that of the semiconductor substrate 20, and may be determined by the types of the MOS transistors formed subsequently. Specifically, for PMOS transistors, the first epitaxial layer 24 may have a lattice constant bigger than that of the semiconductor substrate 20, which may generate compressive stress to improve performance of PMOS transistors; and for NMOS transistors, the first epitaxial layer 24 may have a lattice constant smaller than that of the semiconductor substrate 20, which may generate tensile stress to improve performance of NMOS transistors.

Although the present invention has been disclosed as above with reference to preferred embodiments thereof, the present invention is not limited thereto. Those skilled in the art may make modification and variation to the embodiments without departing from the spirit and scope of the present invention. Accordingly, the scope of the present invention shall be defined in the appended claims.

What is claimed is:

1. A Shallow Trench Isolation (STI) structure, comprising:
a semiconductor substrate;
a first trench formed on the upper surface of the semiconductor substrate and filled with an epitaxial layer, wherein the upper surface of the epitaxial layer is higher than that of the semiconductor substrate; and
a second trench formed on the epitaxial layer and filled with a first dielectric layer, wherein the upper surface of the first dielectric layer is flushed with that of the epitaxial layer, and the width of the second trench is smaller than that of the first trench; and
wherein the epitaxial layer comprises a first epitaxial layer and a second epitaxial layer located thereon; and wherein the material of the first epitaxial layer is different from that of the semiconductor substrate, and the material of the second epitaxial layer is the same as that of the semiconductor substrate.

2. The STI structure of claim 1, wherein the semiconductor substrate is any one of a silicon substrate, a silicon germanium substrate, a III-V compound substrate, a silicon carbide substrate or a stacked structure thereof, or a silicon on insulator substrate, or a diamond substrate.

3. The STI structure of claim 1, wherein the upper surface of the epitaxial layer is higher than that of the semiconductor substrate by 20 nm to 30 nm.

4. The STI structure of claim 1, wherein the material of the epitaxial layer is different from that of the semiconductor substrate.

5. The STI structure of claim 4, wherein the semiconductor substrate is a silicon substrate, and the material of the epitaxial layer is silicon carbide or silicon germanium.

6. The STI structure of claim 1, wherein the semiconductor substrate is a silicon substrate, the material of the first epitaxial layer is silicon carbide or silicon germanium, and the material of the second epitaxial layer is monocrystalline silicon.

7. The STI structure of claim 1, further comprising a third trench formed on the upper surface of the semiconductor substrate and filled with a second dielectric layer, wherein the third trench extends in a direction perpendicular to the first trench and the second trench.

8. The STI structure of claim 1, wherein the second trench penetrates through the epitaxial layer.

9. A method for manufacturing a STI, comprising:
   providing a semiconductor substrate;
   forming a first trench in the semiconductor substrate;
   forming an epitaxial layer in the first trench, wherein the upper surface of the epitaxial layer is higher than that of the semiconductor substrate;
   forming a second trench in the epitaxial layer, wherein the width of the second trench is smaller than that of the first trench; and
   filling the second trench to form a first dielectric layer, wherein the upper surface of the first dielectric layer is flushed with that of the epitaxial layer; and
   wherein forming a first trench in the semiconductor substrate comprises: forming a liner layer and a hard mask layer sequentially on the semiconductor substrate; etching the liner layer and the hard mask layer to define the pattern of the first trench; and etching the semiconductor substrate by using the hard mask layer as a mask to form the first trench; and wherein forming an epitaxial layer in the first trench comprises: forming a first epitaxial layer in the first trench; and forming a second epitaxial layer on the first epitaxial layer, wherein the upper surface of the second epitaxial layer is higher than that of the semiconductor substrate and lower than that of the hard mask layer.

10. The method for manufacturing a STI of claim 9, wherein the semiconductor substrate is any one of a silicon substrate, a silicon germanium substrate, a III-V compound substrate, a silicon carbide substrate, or a stacked structure thereof, or a silicon on insulator substrate, or a diamond substrate.

11. The method for manufacturing a STI of claim 9, wherein the upper surface of the epitaxial layer is higher than that of the semiconductor substrate by 20 nm to 30 nm.

12. The method for manufacturing a STI of claim 9, wherein the epitaxial layer is formed by epitaxial growth or solid phase epitaxy.

13. The method for manufacturing a STI of claim 9, wherein the material of the epitaxial layer is different from that of the semiconductor substrate.

14. The method for manufacturing a STI of claim 13, wherein the semiconductor substrate is a silicon substrate, and, the material of the epitaxial layer is silicon carbide or silicon germanium.

15. The method for manufacturing a STI of claim 9, wherein the material of the first epitaxial layer is different from that of the semiconductor substrate, and the material of the second epitaxial layer is the same as that of the semiconductor substrate.

16. The method for manufacturing a STI of claim 15, wherein the semiconductor substrate is a silicon substrate, the material of the first epitaxial layer is silicon carbide or silicon germanium, and the material of the second epitaxial layer is monocrystalline silicon.

17. The method for manufacturing a STI of claim 9, wherein forming a second epitaxial layer comprises:
   forming spacers on sidewalls of the hard mask layer on the second epitaxial layer; and
   etching the second epitaxial layer, the first epitaxial layer and the semiconductor substrate by using the spacers as masks to form the second trench.

18. The method for manufacturing a STI of claim 17, wherein filling the second trench to form a first dielectric layer comprises:
   filling the second trench to form the first dielectric layer, and planarizing the first dielectric layer until the upper surface of the first dielectric layer is flushed with that of the hard mask layer; and
   removing the liner layer, the hard mask layer, the spacers, and a part of the first dielectric layer which is higher than the epitaxial layer.

19. The method for manufacturing a STI of claim 18, wherein the spacers and the hard mask layer are made of the same material, and the spacers and the hard mask layer are removed by a wet etching process at the same time.

20. The method for manufacturing a STI of claim 19, wherein the spacers and the hard mask layer are made of silicon nitride, and the solution used in the wet etching process is hot phosphoric acid solution.

21. The method for manufacturing a STI of claim 9, further comprising:
   forming a third trench on the upper surface of the semiconductor substrate, wherein the third trench extends in a direction perpendicular to the first trench and the second trench; and filling the third trench with a second dielectric layer.

22. The method for manufacturing a STI of claim 9, wherein the second trench penetrates through the epitaxial layer.

\* \* \* \* \*